United States Patent
Aizawa et al.

(10) Patent No.: US 11,103,972 B2
(45) Date of Patent: Aug. 31, 2021

(54) BUFF PROCESSING DEVICE AND SUBSTRATE PROCESSING DEVICE

(71) Applicant: EBARA CORPORATION, Tokyo (JP)

(72) Inventors: Hideo Aizawa, Tokyo (JP); Junji Kunisawa, Tokyo (JP); Mitsuru Miyazaki, Tokyo (JP); Naoki Toyomura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 534 days.

(21) Appl. No.: 15/776,733

(22) PCT Filed: Oct. 11, 2016

(86) PCT No.: PCT/JP2016/080071
§ 371 (c)(1),
(2) Date: May 16, 2018

(87) PCT Pub. No.: WO2017/086055
PCT Pub. Date: May 26, 2017

(65) Prior Publication Data
US 2018/0345452 A1     Dec. 6, 2018

(30) Foreign Application Priority Data
Nov. 17, 2015    (JP) .............................. JP2015-224669

(51) Int. Cl.
*B24B 41/047*     (2006.01)
*H01L 21/02*       (2006.01)
*H01L 21/67*       (2006.01)

(52) U.S. Cl.
CPC ...... *B24B 41/047* (2013.01); *H01L 21/02052* (2013.01); *H01L 21/02096* (2013.01); *H01L 21/67051* (2013.01); *H01L 21/67219* (2013.01)

(58) Field of Classification Search
CPC ..... B24B 41/047; B24B 41/04; B24B 41/044; B24B 41/0475; B24B 47/10; B24B 47/12;
(Continued)

(56) References Cited

U.S. PATENT DOCUMENTS 5,738,574 A     4/1998   Tolles et al.
6,042,457 A *   3/2000   Wilson .................. B24B 53/017
                                                                        451/443
(Continued)

FOREIGN PATENT DOCUMENTS

JP       H04-002464 A     1/1992
JP       H07-314331 A    12/1995
(Continued)

OTHER PUBLICATIONS

Reference JPH11162893 Machine Translation (Year: 1997).*
International Patent Application No. PCT/JP2016/080071; Int'l Search Report; dated Dec. 20, 2016; 3 pages.

*Primary Examiner* — Orlando E Aviles
*Assistant Examiner* — Alberto Saenz
(74) *Attorney, Agent, or Firm* — BakerHostetler

(57) ABSTRACT

In-plane uniformity of buff processing is improved. According to a first form, a buff processing device for executing buff processing of a substrate is provided. Such buff processing device has a rotatable shaft, a buff head body, a torque transmission mechanism for transmitting rotation of the shaft to the buff head body, and an elastic member for elastically supporting the buff head body in a longitudinal direction of the shaft.

12 Claims, 10 Drawing Sheets

(58) Field of Classification Search
CPC ......... H01L 21/02052; H01L 21/02096; H01L 21/67051; H01L 21/67219
USPC ... 451/41, 56, 285, 286, 287, 288, 289, 290, 451/443
See application file for complete search history.

(56) References Cited

U.S. PATENT DOCUMENTS

| | | |
|---|---|---|
| 6,540,587 B1 | 4/2003 | Gotkis et al. |
| 6,957,998 B2 * | 10/2005 | Togawa .................. B24B 37/30 451/288 |
| 8,382,558 B2 * | 2/2013 | Watanabe ............. B24B 53/017 451/443 |
| 2002/0132559 A1 | 9/2002 | Togawa |
| 2009/0325469 A1 | 12/2009 | Koo et al. |
| 2010/0190417 A1 | 7/2010 | Watanabe et al. |
| 2013/0288578 A1 | 10/2013 | Chen et al. |

FOREIGN PATENT DOCUMENTS

| | | | |
|---|---|---|---|
| JP | 11162893 A | * | 6/1999 |
| JP | H11-162893 A | | 6/1999 |
| JP | 2002-198329 A | | 7/2002 |
| JP | 2002-280337 A | | 9/2002 |
| JP | 2005-505122 A | | 2/2005 |
| JP | 3136333 U | | 10/2007 |
| JP | 2010-012591 A | | 1/2010 |
| JP | 2010-050436 A | | 3/2010 |
| JP | 2010-172996 A | | 8/2010 |
| JP | 2014-050899 A | | 3/2014 |
| JP | 2014-097231 A | | 5/2014 |
| JP | 2015-517923 A | | 6/2015 |

* cited by examiner

BUFF PROCESSING DEVICE AND SUBSTRATE PROCESSING DEVICE

CROSS-REFERENCE TO RELATED APPLICATIONS

This application is the national stage of International Application No. PCT/JP2016/080071 filed Oct. 11, 2016, which claims the benefit of Japanese Patent Applications No. JP 2015-224669, filed Nov. 17, 2015, the entirety of which are incorporated herein by reference.

TECHNICAL FIELD

The Present invention relates to a buff processing device and a substrate processing device. Moreover, the present invention relates to a maintenance method of a cover used for the buff processing device and the buff processing device.

BACKGROUND ART

Recently, a processing device for executing various kinds of processing for articles to be processed (substrates such as semiconductor wafers or various films formed on a surface of a substrate, for example) has been used. An example of the processing device is a CMP (Chemical Mechanical Polishing) device for executing polishing processing or the like of the article to be processed.

The CMP device includes a polishing unit for executing the polishing processing for the article to be processed, a washing unit for executing washing processing and drying processing of the article to be processed, a load/unload unit for delivering the target to be processed to the polishing unit and for receiving the article to be processed for which the washing processing and the drying processing have been executed by the washing unit and the like. Moreover, the CMP device includes a conveyance mechanism for conveying the article to be processed in the polishing unit, the washing unit, and the load/unload unit. The CMP device sequentially executes the various kinds of processing of polishing, washing, and drying while conveying the article to be processed by the conveyance mechanism.

Moreover, a processing unit for slight and additional polishing of the substrate or removing adhesions on the substrate and washing it while a contact member with a diameter smaller than the substrate is pressed onto the substrate and relatively moved with respect to the substrate after the polishing treatment is provided in the CMP device separately from a main polishing unit in some cases.

CITATION LIST

Patent Literature

PTL 1: Japanese Patent Laid-Open No. 2010-50436
PTL 2: Japanese Patent Laid-Open No. 11-162893

SUMMARY OF INVENTION

Technical Problem

In the processing unit using the contact member with the diameter smaller than the substrate as described above, in-plane uniformity of the substrate to be processed is preferably ensured. When the substrate is being processing by using the small-diameter contact member or when the processing is finished, and the contact member is to be separated from the substrate, if parallelism between the contact member and the substrate is not held, partial over-polishing, eccentric abrasion or a scratch can occur on the substrate.

Moreover, in the polishing processing or washing processing of the substrate in general, liquids such as a slurry, a chemical agent and pure water are used in some cases. Thus, in order to prevent entry of the various liquids used in the processing into a driving unit for driving the contact member, a cover is provided in the periphery of the contact member in some cases. However, if the cover is provided in the periphery of the contact member, time is required for removing the cover in maintenance of the contact member such as a replacement work.

Solution to Problem

The present invention is intended to solve at least a part of the aforementioned problem at least partially.

According to one aspect, a buff processing device for executing buff processing of a substrate is provided. Such buff processing device has a rotatable shaft, a buff head body, a torque transmission mechanism for transmitting rotation of the shaft to the buff head body, and an elastic member for elastically supporting the buff head body in a longitudinal direction of the shaft.

DESCRIPTION OF EMBODIMENTS

Figure 1:
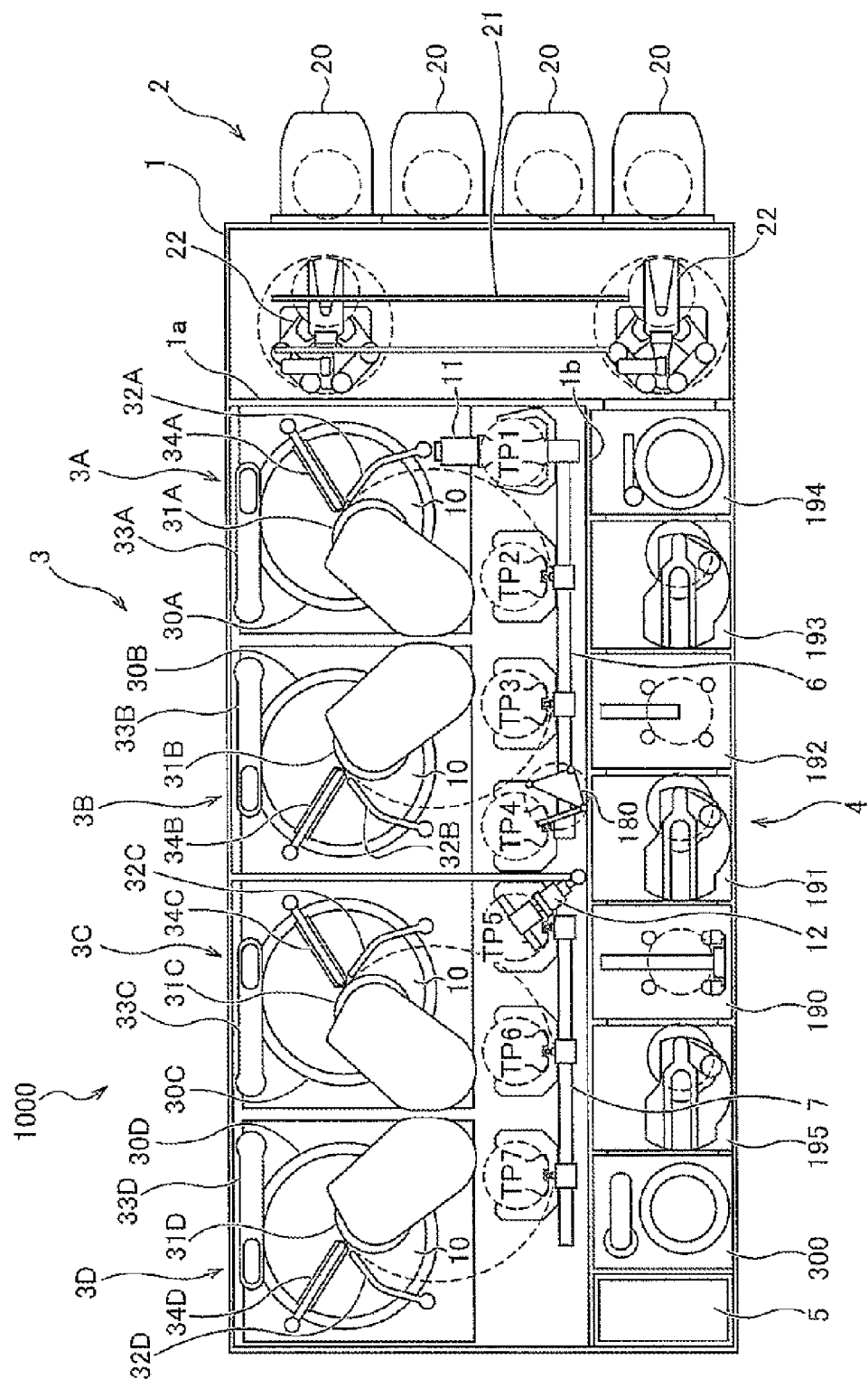
FIG. 1 is a plan view illustrating an entire constitution of a processing device according to an embodiment.

Hereinafter, an embodiment of a buff processing device which is a substrate processing device according to the present invention will be described with the attached drawings. In the attached drawings, the same or similar reference numerals are given to the same or similar elements, and duplicated explanation on the same or similar elements will be omitted in the description of each embodiment in some cases. Moreover, features illustrated in each embodiment can be applied to another embodiment as long as they do not contradict each other.

<Processing Device>

FIG. 1 is a plan view illustrating an entire constitution of the processing device according to an embodiment of the present invention. As illustrated in FIG. 1, the processing device (CMP device) 1000 for executing processing for an article to be processed includes a substantially rectangular housing 1. An inside of the housing 1 is divided by bulkheads 1a and 1b into a load/unload unit 2, a polishing unit 3, and a washing unit 4. The load/unload unit 2, the polishing unit 3, and the washing unit 4 are assembled independently and exhausted independently. Moreover, the washing unit 4 includes a power supply unit for supplying power to the processing device and a control device 5 for controlling a processing operation.

<Load/Unload Unit>

The load/unload unit 2 includes two or more (four in this embodiment) front load units 20 on which wafer cassettes for stocking a large number of articles to be processed (a wafer (substrate), for example) are mounted. These front load units 20 are arranged adjacent to the housing 1 and are aligned along a width direction of the processing device (a direction perpendicular to a longitudinal direction). The front load unit 20 is configured such that an open cassette, an SMIF (Standard Manufacturing Interface) pod or a FOUP (Front Opening Unified Pod) can be mounted thereon. Here, the SMIF and the FOUP are sealed containers capable of keeping an environment independent of an outside space by housing a wafer cassette inside and by covering it with the bulkhead.

Moreover, a running mechanism 21 is laid in the load/unload unit 2 along the alignment of the front load units 20. On the running mechanism 21, two conveying robots (loaders, conveyance mechanisms) 22 movable along the alignment direction of the wafer cassettes are installed. The conveying robot 22 is configured to be capable of accessing a wafer cassette mounted on the front load unit 20 by moving on the running mechanism 21. The conveying robot 22 includes two upper and lower hands. The upper hand is used when the processed wafer is to be returned to the wafer cassette. The lower hand is used when the wafer before the processing is taken out of the wafer cassette. As described above, the upper and lower hands can be used separately. Furthermore, the lower hand of the conveying robot 22 is configured to be capable of inverting the wafer.

Since the load/unload unit 2 is a region where the cleanest state needs to be kept, the inside of the load/unload unit 2 is maintained at a pressure higher than any of the outside the processing device, in the polishing unit 3, and the washing unit 4 at all times. The polishing unit 3 is the dirtiest region since slurry is used as a polishing liquid. Therefore, a negative pressure is formed inside the polishing unit 3, and its pressure is maintained lower than an internal pressure of the washing unit 4. In the load/unload unit 2, a filter fan unit (not shown) having a clean air filter such as an HEPA filter, an ULPA filter or a chemical filter is provided. From the filter fan unit, a clean air from which particles, a toxic steam or a toxic gas is removed is blown out at all times.

<Polishing Unit>

The polishing unit 3 is a region where a wafer is polished (flattened). The polishing unit 3 includes a first polishing module 3A, a second polishing module 3B, a third polishing module 3C, and a fourth polishing module 3D. The first polishing module 3A, the second polishing module 3B, the third polishing module 3C, and the fourth polishing module 3D are aligned along the longitudinal direction of the processing device as illustrated in FIG. 1.

As illustrated in FIG. 1, the first polishing module 3A includes a polishing table 30A on which a polishing pad (polishing tool) 10 having a polishing surface is mounted, a top ring 31A for holding a wafer and polishing it while pressing it onto the polishing pad 10 on the polishing table 30A, a polishing-liquid supply nozzle 32A for supplying a polishing liquid or a dressing liquid (pure water, for example) to the polishing pad 10, a dresser 33A for carrying out dressing of the polishing surface of the polishing pad 10, and an atomizer 34A for injecting a mixed fluid of the liquid (pure water, for example) and a gas (a nitrogen gas, for example) or a liquid (pure water, for example) so as to remove the slurry or the polishing product on the polishing surface and a polishing pad residues by the dressing.

Similarly, the second polishing module 3B includes a polishing table 30B, a top ring 31B, a polishing-liquid supply nozzle 32B, a dresser 33B, and an atomizer 34B. The third polishing module 3C includes a polishing table 30C, a top ring 31C, a polishing-liquid supply nozzle 32C, a dresser 33C, and an atomizer 34C. The fourth polishing module 3D includes a polishing table 30D, a top ring 31D, a polishing-liquid supply nozzle 32D, a dresser 33D, and an atomizer 34D.

The first polishing module 3A, the second polishing module 3B, the third polishing module 3C, and the fourth polishing module 3D have the same constitution as each other and thus, only the first polishing module 3A will be described hereinafter.

Figure 2:
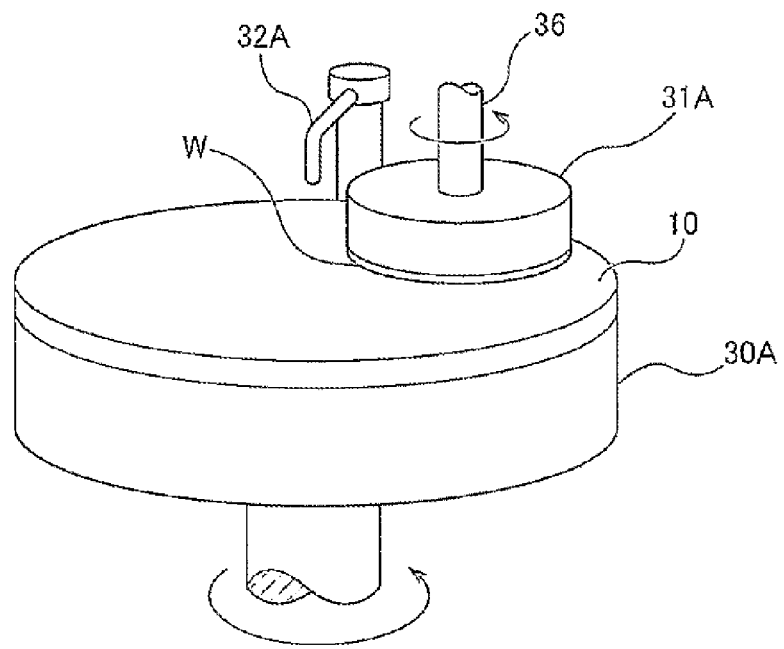
FIG. 2 is a perspective view schematically illustrating a polishing module according to the embodiment.

FIG. 2 is a perspective view schematically illustrating the first polishing module 3A. The top ring 31A is supported by a top ring shaft 36. The polishing pad 10 is bonded to an upper surface of the polishing table 30A. An upper surface of the polishing pad 10 forms a polishing surface for polishing a wafer W. Instead of the polishing pad 10, a fixed abrasive grain can be used. The top ring 31A and the polishing table 30A are configured so as to rotate around its axis as illustrated by an arrow. The wafer W is held by vacuum suctioning on a lower surface of the top ring 31A. In polishing, in a state where a polishing liquid is supplied to the polishing surface of the polishing pad 10 from the polishing-liquid supply nozzle 32A, the wafer W which is a target to be polished is pressed by the top ring 31A onto the polishing surface of the polishing pad 10 and polished.

<Conveyance Mechanism>

Subsequently, a conveyance mechanism for conveying the wafer will be described. As illustrated in FIG. 1, a first linear transporter 6 is arranged adjacent to the first polishing module 3A and the second polishing module 3B. The first linear transporter 6 is a mechanism for conveying the wafer among four conveyance positions (a first conveyance position TP1, a second conveyance position TP2, a third conveyance position TP3, and a fourth conveyance position TP4 in order from the load/unload unit side) along a direction where the polishing modules 3A and 3B are aligned.

Moreover, adjacent to the third polishing module 3C and the fourth polishing module 3D, a second linear transporter 7 is arranged. The second linear transporter 7 is a mechanism for conveying the wafer among three conveyance positions (a fifth conveyance position TP5, a sixth conveyance position TP6, and a seventh conveyance position TP7 in order from the load/unload unit side) along the direction where the polishing modules 3C and 3D are aligned.

The wafer is conveyed by the first linear transporter 6 to the polishing modules 3A and 3B. The top ring 31A of the first polishing module 3A is moved by a swing operation of the top ring head between the polishing position and the second conveyance position TP2. Therefore, the delivery of the wafer to the top ring 31A is performed at the second conveyance position TP2. Similarly, the top ring 31B of the second polishing module 3B is moved between the polishing position and the third conveyance position TP3, and the delivery of the wafer to the top ring 31B is performed at the third conveyance position TP3. The top ring 31C of the third polishing module 3C is moved between the polishing position and the sixth conveyance position TP6, and the delivery of the wafer to the top ring 31C is performed at the sixth conveyance position TP6. The top ring 31D of the fourth polishing module 3D is moved between the polishing position and the seventh conveyance position TP7, and the delivery of the wafer to the top ring 31D is performed at the seventh conveyance position TP7.

At the first conveyance position TP1, a lifter 11 for receiving the wafer from the conveying robot 22 is arranged. The wafer is delivered from the conveying robot 22 to the first linear transporter 6 through the lifter 11. Located between the lifter 11 and the conveying robot 22, a shutter (not shown) is provided on the bulkhead 1a, and at conveyance of the wafer, the shutter is opened, and the wafer is delivered from the conveying robot 22 to the lifter 11. Moreover, among the first linear transporter 6, the second linear transporter 7, and the washing unit 4, a swing transporter 12 is arranged. The swing transporter 12 has a hand moveable between the fourth conveyance position TP4 and the fifth conveyance position TP5. The delivery of the wafer from the first linear transporter 6 to the second linear transporter 7 is performed by the swing transporter 12. The wafer is conveyed by the second linear transporter 7 to the third polishing module 3C and/or the fourth polishing module 3D. Moreover, the wafer polished in the polishing unit 3 is conveyed to the washing unit 4 via the swing transporter 12. On a side of the swing transporter 12, a temporary base 180 for the wafer W installed on a frame, not shown, is arranged. The temporary base 180 is arranged adjacent to the first linear transporter 6 and is located between the first linear transporter 6 and the washing unit 4.

<Washing Unit>

Figure 3A:
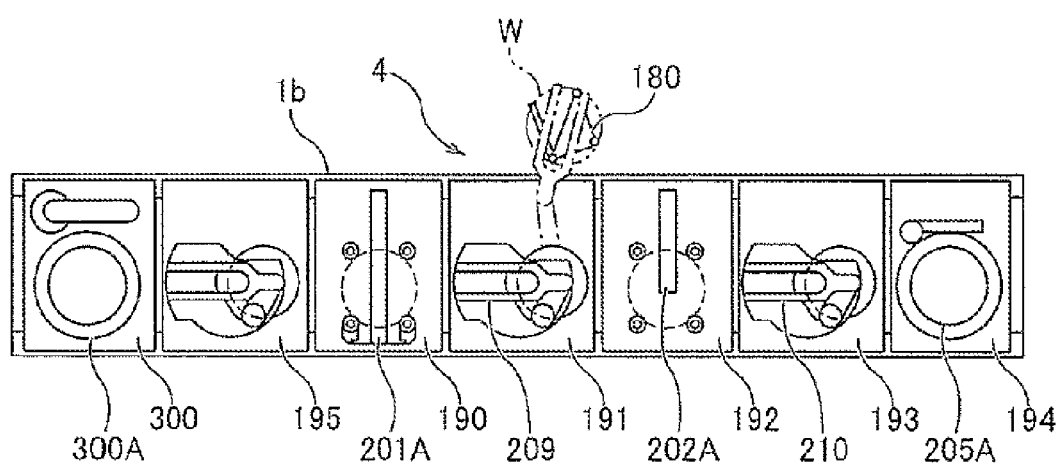
FIG. 3A is a plan view of a washing unit according to the embodiment.
Figure 3B:
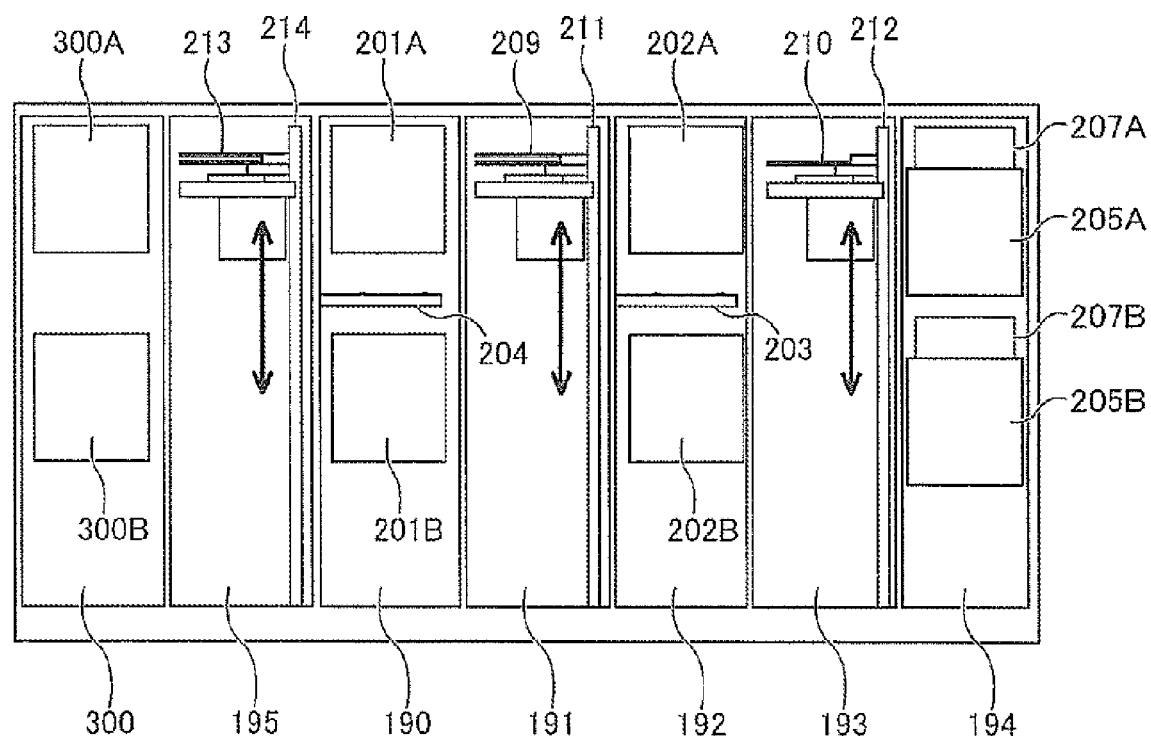
FIG. 3B is a side view of a washing unit according to the embodiment.

FIG. 3A is a plan view illustrating the washing unit 4, and FIG. 3B is a side view illustrating the washing unit 4. As illustrated in FIGS. 3A and 3B, the washing unit 4 is divided into a roll washing chamber 190, a first conveyance chamber 191, a pen washing chamber 192, a second conveyance chamber 193, a drying chamber 194, a buff processing chamber 300, and a third conveyance chamber 195 herein. A pressure balance between each chamber of the polishing unit 3, the roll washing chamber 190, the pen washing chamber 192, the drying chamber 194, and the buff processing chamber 300 can be set to the drying chamber 194>the roll washing chamber 190, and the pen washing chamber 192>the buff processing chamber 300≥the polishing unit 3. The polishing liquid is used in the polishing unit, and the polishing liquid is used as a buff processing liquid also in the buff processing chamber in some cases. Thus, by setting the pressure balance as above, inflow of particle components particularly such as the abrasive grains in the polishing liquid into the washing and drying chambers can be prevented, and maintenance of cleanliness in the washing and drying chambers is made possible.

In the roll washing chamber 190, an upper roll washing module 201A and a lower roll washing module 201B aligned along a vertical direction are arranged. The upper roll washing module 201A is arranged above the lower roll washing module 201B. The upper roll washing module 201A and the lower roll washing module 201B are washing machines for washing the wafer by pressing two rotating roll sponges (first washing tools) to front and rear surfaces of the wafer, respectively, while supplying the washing liquid to the front and rear surfaces of the wafer. Between the upper roll washing module 201A and the lower roll washing module 201B, a temporary base 204 for the wafer is provided.

In the pen washing chamber 192, an upper pen washing module 202A and a lower pen washing module 202B aligned along the vertical direction are arranged. The upper pen washing module 202A is arranged above the lower pen washing module 202B. The upper pen washing module 202A and the lower pen washing module 202B are washing machines for washing the wafer by pressing a rotating pencil sponge (second washing tool) onto the surface of the wafer and by swinging it in a radial direction of the wafer, while supplying the washing liquid to the surface of the wafer. Between the upper pen washing module 202A and the lower pen washing module 202B, a temporary base 203 for the wafer is provided.

In the drying chamber 194, an upper drying module 205A and a lower drying module 205B aligned along the vertical direction are arranged. The upper drying module 205A and the lower drying module 205B are isolated from each other. Above the upper drying module 205A and the lower drying module 205B, filter fan units 207A and 207B for supplying clean air into the drying modules 205A and 205B, respectively, are provided.

The upper roll washing module 201A, the lower roll washing module 201B, the upper pen washing module 202A, the lower pen washing module 202B, the temporary base 203, the upper drying module 205A, and the lower drying module 205B are fixed to a frame, not shown, by a bolt or the like.

In the first conveyance chamber 191, a first conveying robot (conveyance mechanism) 209 capable of vertical movement is arranged. In the second conveyance chamber 193, a second conveying robot 210 capable of vertical movement is arranged. In the third conveyance chamber 195, a third conveying robot (conveyance mechanism) 213 capable of vertical movement is arranged. The first conveying robot 209, the second conveying robot 210, and the third conveying robot 213 are movably supported by support shafts 211, 212, and 214 extending in a vertical direction, respectively. The first conveying robot 209, the second conveying robot 210, and the third conveying robot 213 have driving mechanisms such as a motor inside and are movable vertically along the support shafts 211, 212, and 214. The first conveying robot 209 has two-stage hands, that is, upper and lower hands similarly to the conveying robot 22. The first conveying robot 209 is arranged at a position where its lower hand can access the aforementioned temporary base 180 as indicated by a dotted line in FIG. 3A.

When the lower hand of the first conveying robot 209 accesses the temporary base 180, the shutter (not shown) provided on the bulkhead 1b is opened.

The first conveying robot 209 operates so as to convey the wafer W among the temporary base 180, the upper roll washing module 201A, the lower roll washing module 201B, the temporary base 204, the temporary base 203, the upper pen washing module 202A, and the lower pen washing module 202B. When the wafer before washing (wafer to which the slurry adheres) is to be conveyed, the first conveying robot 209 uses the upper hand and when the wafer after the washing is to be conveyed, it uses the upper hand.

The second conveying robot 210 operates so as to convey the wafer W among the upper pen washing module 202A, the lower pen washing module 202B, the temporary base 203, the upper drying module 205A, and the lower drying module 205B. The second conveying robot 210 conveys only the washed wafer and thus, it includes only one hand. The conveying robot 22 illustrated in FIG. 1 takes out the wafer from the upper drying module 205A or the lower drying module 205B by using the upper hand and returns the wafer to the wafer cassette. When the upper hand of the conveying robot 22 accesses the drying modules 205A and 205B, the shutter (not shown) provided on the bulkhead 1a is opened.

In the buff processing chamber 300, an upper buff processing module 300A and a lower buff processing module 300B are provided. The third conveying robot 213 operates so as to convey the wafer W among the upper roll washing module 201A, the lower roll washing module 201B, the temporary base 204, the upper buff processing module 300A, and the lower buff processing module 300B.

In this embodiment, the example in which, in the washing unit 4, the buff processing chamber 300, the roll washing chamber 190, and the pen washing chamber 192 are aligned and arranged in order from the farthest from the load/unload unit 2 is illustrated, but this is not limiting. An arrangement form of the buff processing chamber 300, the roll washing chamber 190, and the pen washing chamber 192 can be selected as appropriate in accordance with a quality and a throughput of the wafer and the like. Moreover, in this embodiment, the example including the upper buff processing module 300A and the lower buff processing module 300B is illustrated, but this is not limiting, and only one of the buff processing modules may be provided. Moreover, in this embodiment, other than the buff processing chamber 300, the roll washing module and the pen washing module are cited in the explanation of a module for washing the wafer W, but this is not limiting, and 2-fluid jet washing (2FJ washing) or mega-sonic washing can be performed. The 2-fluid jet washing is to remove (wash) the particles and the like on the wafer W surface by causing micro droplets (mist) on a high-speed gas to be injected from a 2-fluid nozzle toward the wafer W and to collide against it and by using an impact wave generated by the collision of the micro droplets onto the wafer W surface. The mega-sonic washing is to apply supersonic waves to the washing liquid and to cause an acting force by an oscillation acceleration of the washing liquid molecules to act on adhering particles such as particles and to remove them. Hereinafter, the upper buff processing module 300A and the lower buff processing module 300B will be described. Since the upper buff processing module 300A and the lower buff processing module 300B have the similar constitutions, only the upper buff processing module 300A will be described.

<Buff Processing Module>

Figure 4:
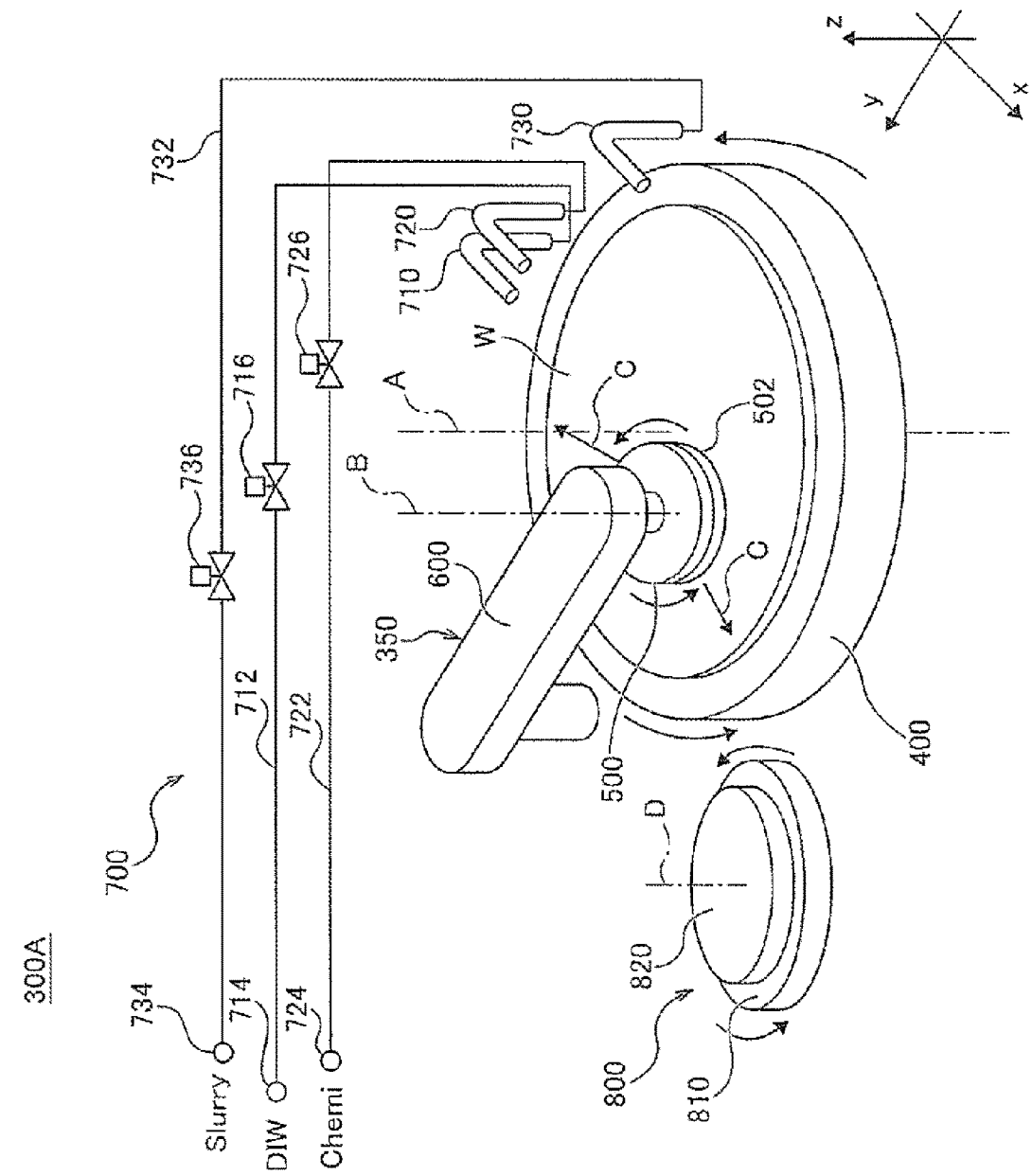
FIG. 4 is a view illustrating a schematic constitution of a buff processing module according to the embodiment.

FIG. 4 is a view illustrating a schematic constitution of the upper buff processing module. The upper buff processing module 300A includes a buff table 400 on which the wafer W is installed, a buff processing component 350, a liquid supply system 700 for supplying a buff processing liquid, and a conditioning unit 800 for conditioning (dressing) a buff pad 502 as illustrated in FIG. 4. The buff processing component 350 includes a buff head 500 on which the buff pad 502 for executing the buff processing on the processing surface of the wafer W is mounted and a buff arm 600 for holding the buff head 500.

The buff processing liquid includes at least one of DIW (pure water), a washing chemical liquid, and a polishing liquid such as slurry. There are mainly two types of buff processing methods. One is a method of removing a contaminant such as the slurry remaining the article on the wafer to be processed or a residue of a polishing product at contact with the buff pad. The other method is a method of removing a certain amount of the article to be processed to which the contaminant adheres by polishing or the like. In the former, the buff processing liquid is preferably the washing chemical liquid or DIW, while in the latter, the polishing liquid is preferable. However, in the latter, a removal amount in the aforementioned processing is preferably less than 10 nm, for example, or more preferably 5 nm or less for maintenance of a state of a processed surface (flatness or a remaining film amount) after the CMP, and in this case, a removing speed as the normal CMP is not needed in some cases. In such a case, the processing speed may be adjusted by executing processing such as dilution of the polishing liquid as appropriate. Moreover, the buff pad 502 is formed of a foamed polyurethane-based hard pad, a suede-based soft pad or a sponge or the like, for example. The type of the buff pad only needs to be selected as appropriate in accordance with a material of an article to be processed or a state of a contaminant to be removed. For example, if the contaminant is buried in the surface of an article to be processed, a hard pad which can cause a physical force to act on the contaminant more easily, that is, a pad with higher hardness or rigidity may be used as a buff pad. On the other hand, if the article to be processed is a material with small mechanical strength such as a Low-k film or the like, for example, the soft pad may be used in order to reduce damage on the processed surface. Moreover, if the buff processing liquid is the polishing liquid such as slurry, the removing speed of the article to be removed, removal efficiency of the contaminant or presence of occurrence of damage is not only determined simply by the hardness or rigidity of the buff pad and thus, it may be selected as appropriate. Moreover, a groove shape such as a concentric groove, an XY groove, a spiral groove, a radial groove and the like, for example, may be formed on the surfaces of these buff pads. Furthermore, at least one or more holes penetrating the buff pad may be provided in the buff pad so that the buff processing liquid is supplied through this hole. Moreover, a sponge-like material through which the buff processing liquid can permeate such as a PVA sponge, for example, may be used for the buff pad. By means of them, uniformization of flow distribution of the buff processing liquid in the buff pad surface and rapid discharge of the contaminant removed by the buff processing can be made possible.

The buff table 400 has a mechanism for adsorbing the wafer W. Moreover, the buff table 400 can be rotated around a rotating shaft A by a driving mechanism, not shown. Moreover, the buff table 400 may cause the wafer W to make an angular rotary motion or a scroll motion by the driving mechanism, not shown. The buff pad 502 is mounted on a surface faced with the wafer W of the buff head 500. The buff head 500 can be rotated around a rotating shaft B by the driving mechanism, not shown. Moreover, the buff head 500 can press the buff pad 502 onto the processing surface of the wafer W by the driving mechanism, not shown. The buff arm 600 is capable of moving the buff head 500 within a range of a radius or a diameter of the wafer W as indicated by an arrow C. Moreover, the buff arm 600 is capable of swinging the buff head 500 to a position where the buff pad 502 is faced with the conditioning unit 800.

The conditioning unit 800 is a member for conditioning the surface of the buff pad 502. The conditioning unit 800 includes a dress table 810 and a dresser 820 installed on the dress table 810. The dress table 810 can be rotated around a rotation shaft D by the driving mechanism, not shown. Moreover, the dress table 810 may be configured to cause the dresser 820 to make a scroll motion by the driving mechanism, not shown. The dresser 820 is formed of a diamond dresser on a surface of which diamond particles are electrodeposited or diamond abrasive grains are arranged on the whole or a part of the contact surface with the buff pad, a brush dresser on which brush bristles made of a resin are arranged on the whole or a part of the contact surface with the buff pad or a combination of them.

The upper buff processing module 300A turns the buff arm 600 until the buff pad 502 comes to a position faced with the dresser 820 in conditioning of the buff pad 502. The upper buff processing module 300A performs conditioning of the buff pad 502 by rotating the dress table 810 around a rotation shaft D, while rotating the buff head 500 and by pressing the buff pad 502 onto the dresser 820. As conditioning conditions, a conditioning load is preferably up to 80 N and is more preferably at 40 N or less from a viewpoint of a life of the buff pad. Moreover, the buff pad 502 and the dresser 820 are preferably used at rotation speeds not higher than 500 rpm. This embodiment illustrates an example in which the processing surface of the wafer W and a dress surface of the dresser 820 are installed along a horizontal direction, but this is not limiting. For example, regarding the upper buff processing module 300A, the buff table 400 and the dress table 810 can be arranged so that the processing surface of the wafer W and the dress surface of the dresser 820 are installed along the vertical direction. In this case, the buff arm 600 and the buff head 500 are arranged so that the buff pad 502 is brought into contact with the processing surface of the wafer W arranged in the vertical direction and the buff processing can be executed, and the buff pad 502 is brought into contact with the dress surface of the dresser 820 arranged in the vertical direction and the conditioning processing can be executed. Moreover, either one of the buff table 400 and the dress table 810 may be arranged in the vertical direction, and the whole or a part of the buff arm 600 may be rotated so that the buff pad 502 arranged on the buff arm 600 becomes perpendicular to each table surface.

The liquid supply system 700 includes a pure-water nozzle 710 for supplying the pure water (DIW) to the processing surface of the wafer W. The pure-water nozzle 710 is connected to a pure-water supply source 714 through a pure-water pipeline 712. An opening/closing valve 716 capable of opening/closing the pure-water pipeline 712 is provided on the pure-water pipeline 712. The control device 5 can supply the pure water to the processing surface of the wafer W at arbitrary timing by controlling opening/closing of the opening/closing valve 716.

Moreover, the liquid supply system 700 includes a chemical-liquid nozzle 720 for supplying the chemical-liquid (Chemi) to the processing surface of the wafer W. The chemical-liquid nozzle 720 is connected to a chemical-liquid supply source 724 through a chemical-liquid pipeline 722. An opening/closing valve 726 capable of opening/closing the chemical-liquid pipeline 722 is provided on the chemical-liquid pipeline 722. The control device 5 can supply the chemical liquid to the processing surface of the wafer W at arbitrary timing by controlling opening/closing of the opening/closing valve 726.

Moreover, the liquid supply system 700 includes a slurry nozzle 730 for supplying the slurry to the processing surface of the wafer W. The slurry nozzle 730 is connected to a slurry supply source 734 through a slurry pipeline 732. An opening/closing valve 736 capable of opening/closing the slurry pipeline 732 is provided on the slurry pipeline 732. The control device 5 can supply the slurry to the processing surface of the wafer W at arbitrary timing by controlling opening/closing of the opening/closing valve 736.

The upper buff processing module 300A can execute the buff processing to the wafer W by supplying the processing liquid to the wafer W and by rotating the buff table 400 around the rotation shaft A, by pressing the buff pad 502 onto the processing surface of the wafer W and by swinging the buff head 500 in the arrow C direction while rotating it around the rotation shaft B. As conditions in the buff processing, though this processing is basically defect removal by a mechanical action, the pressure is preferably 3 psi or less or more preferably 2 psi or less by considering reduction of damage on the wafer W. Moreover, the rotation numbers of the wafer W and the buff head 500 are preferably 1000 rpm or less by considering in-plane distribution of the buff processing liquid. Moreover, a moving speed of the buff head 500 is 300 mm/sec or less. However, since distribution of optimal moving speeds is different depending on the rotation numbers of the wafer W and the buff head 500 and the moving distance of the buff head 500, the moving speed of the buff head 500 in the wafer W surface is preferably variable. As a changing method of the moving speed in this case, such a method is preferable that a swing distance in the wafer W plane is divided into a plurality of sections, for example, and the moving speed can be set to each section. Moreover, as the buff processing liquid flowrate, a large flowrate is preferable for keeping the distribution in the wafer plane of the sufficient processing liquid even when the wafer W and the buff head 500 are rotating at a high speed. On the other hand, however, since an increase in the processing liquid flowrate incurs an increase in a processing cost, the flow rate is preferably 1000 ml/min or less or more preferably 500 ml/min or less.

Here, the buff processing includes at least either one of buff polishing processing and buff washing processing.

The buff polishing processing is processing of polishing/removing the processing surface of the wafer W by relatively moving the wafer W and the buff pad 502 while the buff pad 502 is brought into contact with the wafer W and by interposing polishing such as the slurry between the wafer W and the buff pad 502. The buff polishing processing is processing capable of applying a physical acting force to the wafer W stronger than a physical acting force applied to the wafer W by the roll sponge in the roll washing chamber 190 and a physical acting force applied to the wafer W by the pen sponge in the pen washing chamber 192 to the wafer W. By means of the buff polishing processing, removal of a skin layer portion to which the contaminant adheres, additional removal of a spot which could not be removed by main polishing in the polishing unit 3 or morphology improvement after the main polishing can be realized.

The buff washing processing is processing of removing the contaminants on the wafer W surface or altering the processing surface by relatively moving the wafer W and the buff pad 502 while bringing the buff pad 502 into contact with the wafer W and by interposing the washing processing liquid (the chemical liquid or chemical liquid and the pure water) between the wafer W and the buff pad 502. The buff washing processing is processing capable of applying the physical acting force stronger than the physical acting force applied to the wafer W by the roll sponge in the roll washing chamber 190 and the physical acting force applied to the wafer W by the pen sponge in the pen washing chamber 192 to the wafer W.

Figure 5:
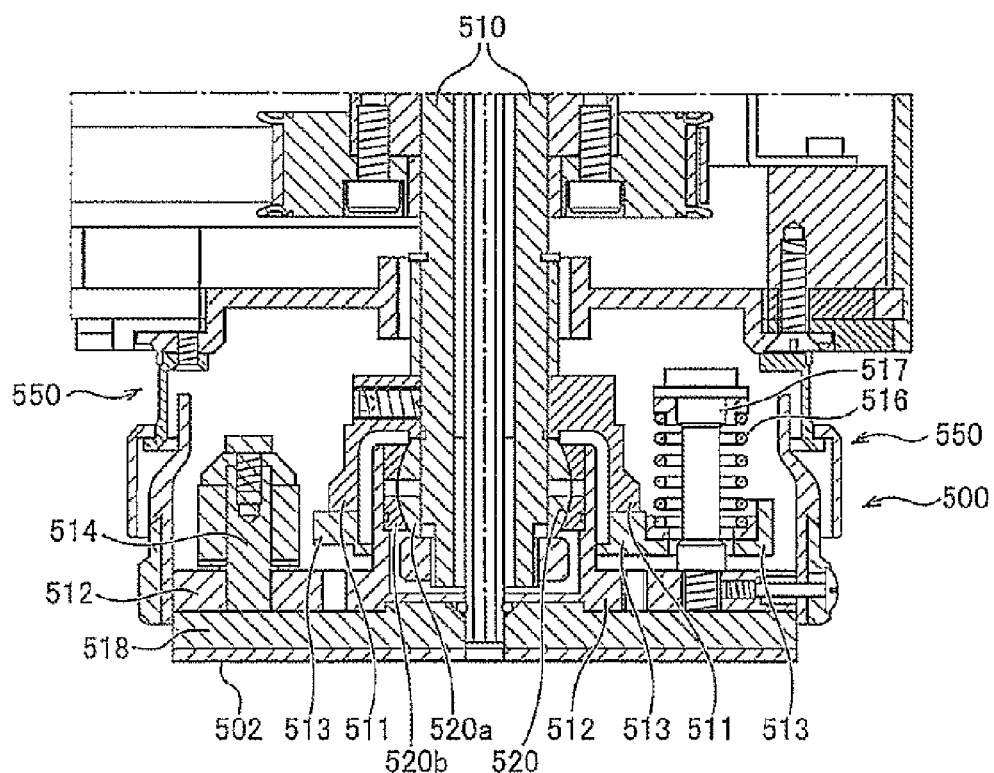
FIG. 5 is a schematic sectional view in a vicinity of a buff head of the buff processing device according to the embodiment.

Subsequently, details of the buff processing device according to the present invention will be described. FIG. 5 is a schematic sectional view in a vicinity of the buff head 500 of the buff processing device according to the embodiment. The buff processing device of this embodiment includes a rotatable shaft 510. To the shaft 510, a rotation driving mechanism such as a motor, not shown, is connected. The shaft 510 extends downward from the buff arm 600. Moreover, in the illustrated embodiment, the shaft 510 is hollow. A pipeline through which a processing liquid such as the slurry, chemical liquid, pure water and the like is passed may be provided inside the shaft 510 so that the processing liquid is supplied from the inside of the buff head. As illustrated in FIG. 5, a boss 511 is fixed to the shaft 510. The boss 511 at least partially includes a cylindrical shape surrounding the entire circumference of the shaft 510. The boss 511 is rotated with the shaft 510. As illustrated in FIG. 5, a buff head flange 513 is fixed to a part of a lower side of the boss 511. The buff head flange 513 has a structure of roughly a disc shape. In the buff head flange 513, a region through which a driving pin 514 and a bolt 517 which will be described later are passed is provided. By means of the rotation of the shaft 510 and the boss 511, the buff head flange 513 is also rotated.

As illustrated in FIG. 5, a spherical sliding bearing 520 is mounted on the shaft 510. More specifically, an inner ring 520a of the spherical sliding bearing 520 is fixed to the shaft 510. An outer ring 520b is arranged on an outer side of the inner ring 520a. An outer surface of the inner ring 520a of the spherical sliding bearing 520 is a spherical projecting surface, while an inner surface of the outer ring 520b is a spherical recess surface. The spherical projecting surface of the inner ring 520a and the spherical recess surface of the outer ring 520b can slide on each other and constitute a gimbal mechanism. A buff head body 512 is fixed to the outer ring 520b of the spherical sliding bearing 520. A buff pad carrier 518 is mounted on a lower surface of the buff head body 512. The buff pad carrier 518 is mounted detachably from the buff head body 512. The buff pad 502 is mounted on a lower surface of the buff pad carrier 518. The buff pad 502 is for executing the buff processing for the wafer W in direct contact with the wafer W. As described above, the buff pad 502 is formed of a foamed polyurethane-based hard pad, a suede-based soft pad or a sponge or the like, for example. In the present invention, the hard pad refers to those with an elastic modulus approximately within a range from 350 psi to 3000 psi. Moreover, in the present invention, the soft pad refers to those with the elastic modulus approximately from 50 psi to 300 psi.

As illustrated in FIG. 5, the buff head flange 513 and the buff head body 512 are connected by the driving pin 514. Thus, rotary torques of the shaft 510, the boss 511, and the buff head flange 513 are transmitted to the buff head body 512. Since the buff head body 512 is rotated/driven, the buff pad carrier 518 and the buff pad 502 can be rotated/driven. As described above, since the gimbal mechanism is formed by the spherical sliding bearing 520, the buff head body 512 can be tilted along a sliding surface of the spherical sliding bearing 520 while being rotated.

As illustrated in FIG. 5, the bolt 517 is screwed into the buff head body 512 through the buff head flange 513. A spring 516 (elastic member) is arranged between a lower surface of a head part of the bolt 517 and the buff head flange 513. Thus, the buff head body 512 is supported by a force of the spring 516. In other words, the spring 516 applies a load to the gimbal operation (tilting) of the buff head body 512. Thus, unless the force is applied to the buff pad 502 from the lower surface, a parallel position of the buff pad 502 is kept by the spring 516. Moreover, by supporting the buff head body 512 by the spring 516, tilt of the buff head 500 during the buff processing of the wafer W, that is, so-called cocking can be prevented or relaxed. A spring constant of the spring 516 is selected by considering a force for supporting the buff head body 512, a load applied to the gimbal operation and the like.

As illustrated in FIG. 5, the buff processing device includes a cover 550 surrounding a periphery of the buff head 500. The cover 550 is to prevent entry of the liquid such as the processing liquid into the buff head 500. Detailed structures of the cover 550 will be described later.

Figure 6:
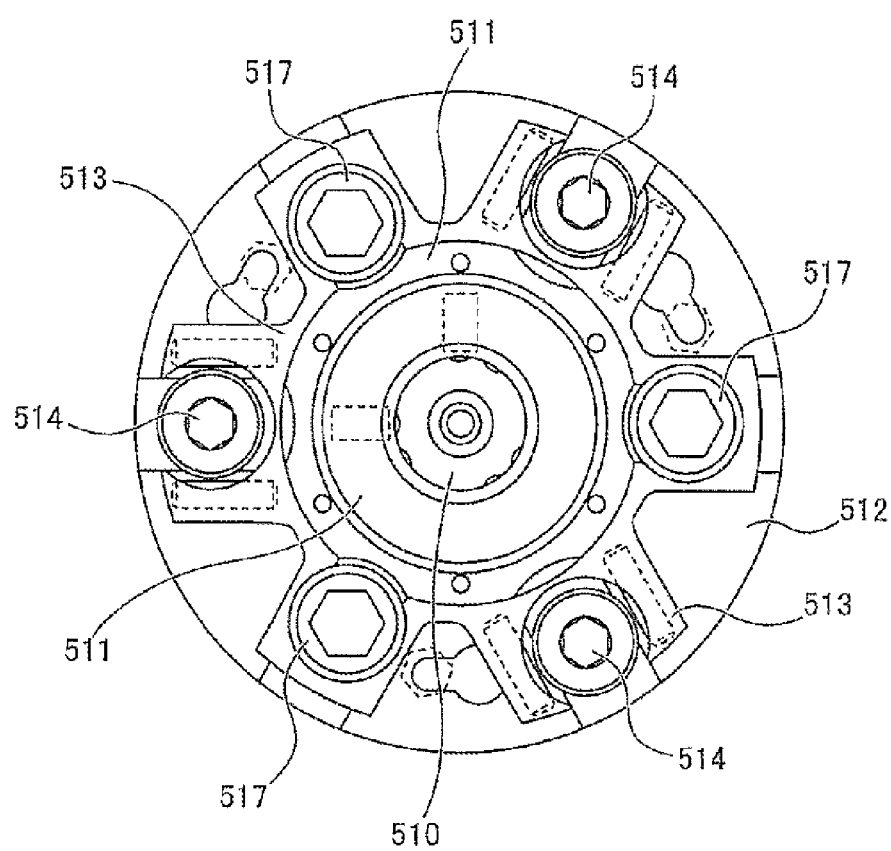
FIG. 6 is a top sectional view of the buff head illustrated in FIG. 5.

FIG. 6 is a top sectional view of the buff head 500 illustrated in FIG. 5. In the embodiment illustrated in FIG. 6, the driving pins 514 and the springs 516 are arranged alternately on a circumferential direction of the buff head 500 three each at an equal interval. As another embodiment, the driving pins 514 and the springs 516 do not have to be three each but may be two each, for example. Alternatively, as another embodiment, four or more driving pins 514 and springs 516, respectively, may be arranged alternately in the circumferential direction of the buff head 500 at the equal interval. It is considered that the larger the numbers of the driving pins 514 and the springs 516 are, the more the in-plane uniformity of the wafer W can be improved in the buff processing.

An operation of the buff processing device of the embodiment illustrated in FIGS. 5 and 6 will be described. When the shaft 510 is rotated, a rotary force is transmitted to the shaft 510, the boss 511, and the buff head flange 513, the rotary force is transmitted to the buff head body 512 by the driving pin 514, and is transmitted to the buff pad carrier 518 and the buff pad 502.

Moreover, when the buff pad 502 is to be pressed onto the wafer W to be processed, a downward force is transmitted to the shaft 510, the inner ring 520a, the outer ring 520b of the spherical sliding bearing 520, the buff head body 512, the buff pad carrier 518, and the buff pad 502 by moving the shaft 510 to a lower direction, and the buff pad 502 can be pressed onto the wafer W.

Moreover, when the buff pad 502 is to be separated from the wafer W to be processed, a lifting force is transmitted to the shaft 510, the boss 511, the buff head flange 513, the spring 516, the bolt 517, the buff head body 512, the buff pad carrier 518, and the buff head 502 by moving the shaft 510 to an upper direction, and the buff pad 502 is separated from the wafer W.

Figure 7:
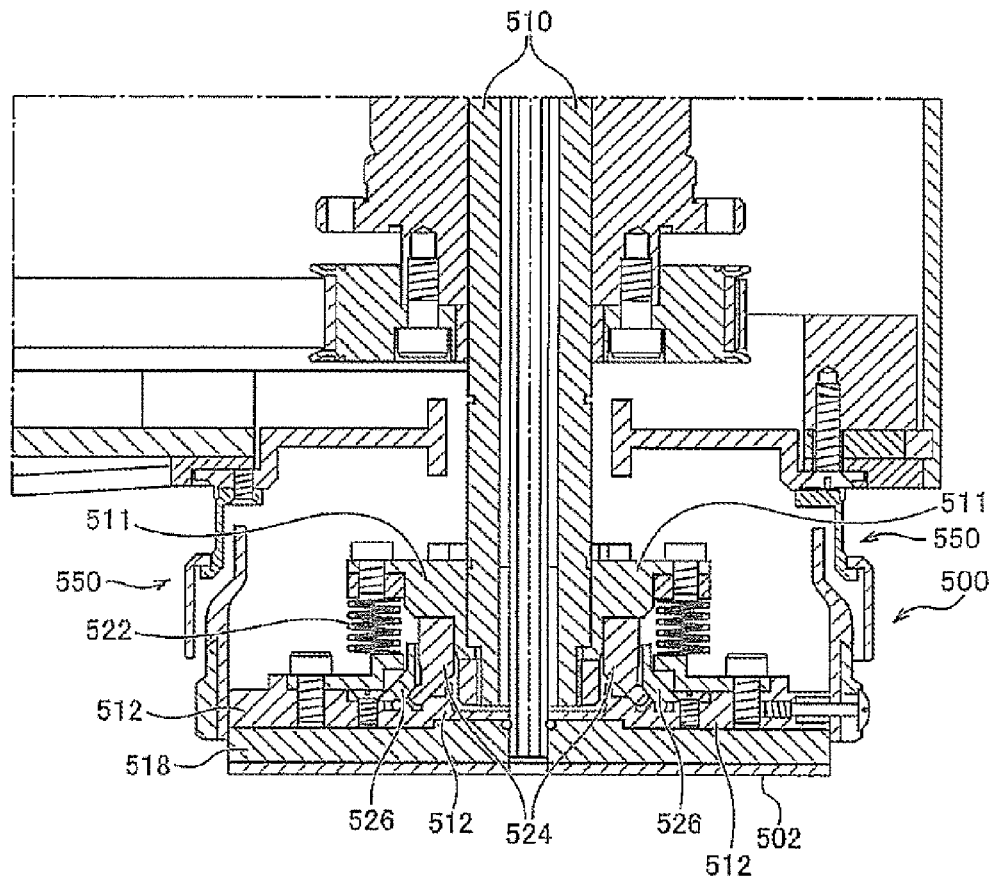
FIG. 7 is a schematic sectional view in the vicinity of the buff head of the buff processing device according to the embodiment.

FIG. 7 is a schematic sectional view in the vicinity of the buff head 500 of the buff processing device according to the embodiment. In the embodiment illustrated in FIG. 7, similarly to the embodiment illustrated in FIG. 5, the shaft 510, the boss 511, the buff head body 512, the buff head carrier 518, and the buff pad 502 are provided. However, in the embodiment illustrated in FIG. 7, instead of the buff head flange 513, the driving pin 514, and the spring 516 in the embodiment in FIG. 5, a ring-shaped bellows-type cup ring 522 is provided. The bellows-type cup ring 522 has one end fixed to the boss 511 and the other end fixed to the buff head body 512 as illustrated in FIG. 7. The bellows-type cup ring 522 has the both functions of the driving pin 514 and the spring 516 in the embodiment in FIG. 5 and transmits the rotary torque of the shaft 510 to the buff head body 512 and elastically supports the buff head body 512. As in the embodiment in FIG. 7, by using the bellows-type cup ring 522, the number of components can be reduced as compared with the embodiment in FIG. 5 and moreover, there is a merit that the entire circumference of the buff head body 512 can be elastically supported. On the other hand, the embodiment using the driving pin 514 and the spring 516 in FIG. 5 has a merit that there are mare options of the spring constant of the spring 516 as compared with the embodiment using the bellows-type cup ring 522.

Moreover, in the embodiment illustrated in FIG. 7, the spherical sliding bearing 520 as illustrated in FIG. 5 is not provided. In the embodiment illustrated in FIG. 7, a head support portion 524 is fixed to a lower side of the boss 511. A lower surface of the head support portion 524 includes a spherical recess surface in contact with the buff head body 512. On the other hand, a region in contact with the head support portion 524 of the buff head body 512 includes a spherical projection surface. The spherical recess surface of the head support portion 524 and the spherical projection surface of the buff head body 512 are capable of sliding motion, and the gimbal mechanism is formed. A rotation center of the gimbal mechanism illustrated in FIG. 7 is at a position lower than the rotation center of the gimbal mechanism of the embodiment illustrated in FIG. 5. In the embodiment in FIG. 7, the rotation center of the gimbal mechanism is located roughly in the vicinity of the surface of the buff pad 502. As an embodiment, the rotation center of the gimbal can be within a range of 10 mm from the surface of the buff pad 502. As an embodiment, if a soft pad is used as the buff pad 502, the rotation center of the gimbal mechanism is set such that a distance from the surface of the buff pad 502 is 0.1 times or less of the diameter of the buff pad 502. On the other hand, if a hard pad is used as the buff pad 502, the rotation center of the gimbal mechanism is set so that the distance from the surface of the buff pad 502 is 0.3 times or less of the diameter of the buff pad 502. As in the embodiment illustrated in FIG. 7, by setting the rotation center of the gimbal mechanism in the vicinity of the surface of the buff pad 502, cocking in the buff processing can be prevented or relaxed. Since the soft pad is more susceptible to an influence of the cocking than the hard pad, when the soft pad is to be used, the rotation center of the gimbal mechanism is preferably set closer to the vicinity of the surface of the buff pad than when the hard pad is to be used.

Moreover, the buff processing device according to the embodiment illustrated in FIG. 7 includes a support member 526. The support member 526 is fixed to the buff head body 512. The support member 526 is arranged so that a part of a lower surface is overlapped with a part of the head support portion 524 in an axial direction. However, there is a gap between the head support portion 524 and the support member 526 and they are configured so as not to be in contact with each other except when the buff head 500 is lifted up from the wafer W.

An operation of the buff processing device of the embodiment illustrated in FIG. 7 will be described. When the shaft 510 is rotated, the rotary force is transmitted to the shaft 510, the boss 511, the bellows-type cup ring 522, the buff head body 512, the buff pad carrier 518, and the buff pad 502.

Moreover, when the buff pad 502 is to be pressed onto the wafer W to be processed, by moving the shaft 510 downward, the downward force is transmitted to the shaft 510, the boss 511, the head support portion 524, the buff head body 512, the buff pad carrier 518, and the buff pad 502, and the buff pad 502 can be pressed onto the wafer W. At this time, the head support portion 524 is not brought into contact with the support member 526.

Moreover, when the buff pad 502 is to be separated from the wafer W to be processed, by moving the shaft 510 upward, the lifting force is transmitted to the shaft 510, the boss 511, and the head support portion 524, and the head support portion 524 is lifted upward. When the head support portion 524 is lifted upward, the head support portion 524 and the support member 526 are brought into contact. At this time, the spherical recess surface of the head support portion 524 and the spherical projection surface of the buff head body 512 constituting the gimbal mechanism are separated. After that, the lifting force is transmitted to the head support portion 524, the support member 526, the buff head body 512, the buff pad carrier 518, and the buff pad 502, and the buff pad 502 is separated from the wafer W. Thus, when the buff pad 502 is lifted up from the wafer W, the buff head body 512 is stably supported by the head support portion 524, and drop of the slurry or the like adhering to the buff head in the buff processing can be prevented.

Figure 8:
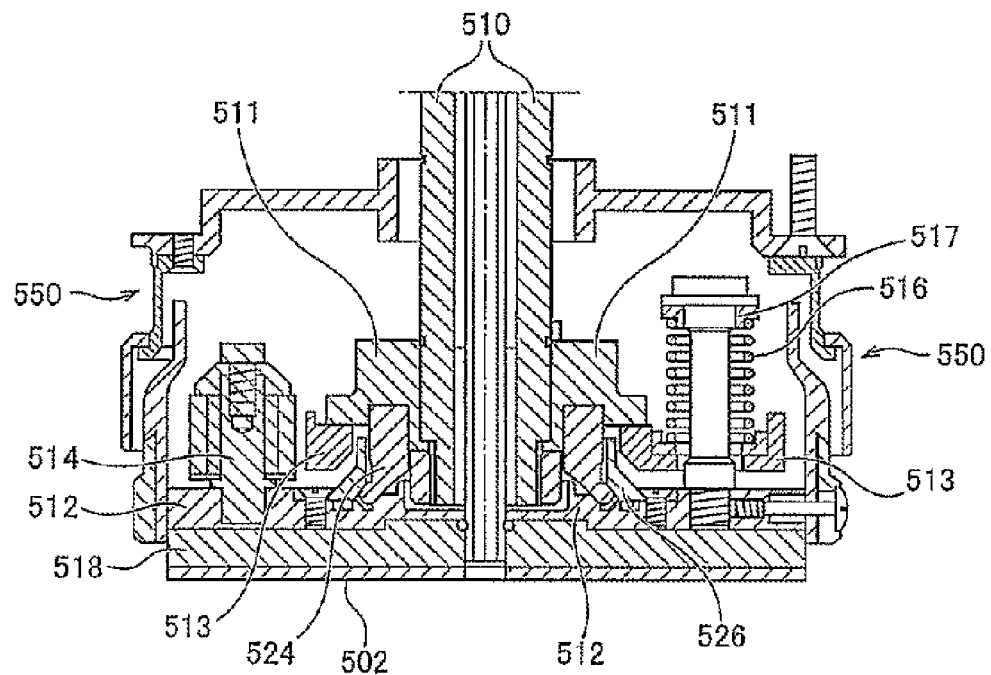
FIG. 8 is a schematic sectional view in the vicinity of the buff head of the buff processing device according to the embodiment.

FIG. 8 is a schematic sectional view in the vicinity of the buff head 500 of the buff processing device according to the embodiment. In the embodiment illustrated in FIG. 8, similarly to the embodiment illustrated in FIG. 5, the shaft 510, the boss 511, the buff head flange 513, the buff head body 512, the driving pin 514, the spring 516, the buff head carrier 518, and the buff pad 502 are provided. In the embodiment illustrated in FIG. 8, the spherical sliding bearing 520 as illustrated in FIG. 5 is not provided. In the buff processing device of the embodiment illustrated in FIG. 8, similarly to the embodiment in FIG. 7, the spherical recess surface of the head support portion 524 and the spherical projection surface of the buff head body 512 form the gimbal mechanism. The rotation center of the gimbal mechanism of the embodiment illustrated in FIG. 8 is at a position lower than the rotation center of the gimbal mechanism of the embodiment illustrated in FIG. 5 similarly to the embodiment illustrated in FIG. 7.

Moreover, the buff processing device according to the embodiment illustrated in FIG. 8 includes the support member 526 fixed to the buff head body 512 similarly to the buff processing device illustrated in FIG. 7.

An operation of the buff processing device of the embodiment illustrated in FIG. 8 will be described. When the shaft 510 is rotated, the rotary force is transmitted to the shaft 510, the boss 511, and the buff head flange 513, and the rotary force is transmitted to the buff head body 512 by the driving pin 514 and is transmitted to the buff pad carrier 518 and the buff pad 502.

Moreover, when the buff pad 502 is to be pressed onto the wafer W to be processed, by moving the shaft 510 downward, the downward force is transmitted to the shaft 510, the boss 511, the head support portion 524, the buff head body 512, the buff pad carrier 518, and the buff pad 502, and the buff pad 502 can be pressed onto the wafer W. At this time, the head support portion 524 is not brought into contact with the support member 526.

Moreover, when the buff pad 502 is to be separated from the wafer W to be processed, by moving the shaft 510 upward, the lifting force is transmitted to the shaft 510, the boss 511, and the head support portion 524, and the head support portion 524 is lifted upward. When the head support portion 524 is lifted upward, the head support portion 524 and the support member 526 are brought into contact. At this time, the spherical recess surface of the head support portion 524 and the spherical projection surface of the buff head body 512 constituting the gimbal mechanism are separated. After that, the lifting force is transmitted to the head support portion 524, the support member 526, the buff head body 512, the buff pad carrier 518, and the buff pad 502, and the buff pad 502 is separated from the wafer W. Thus, when the buff pad 502 is lifted up from the wafer W, the buff head body 512 is stably supported by the head support portion 524, and drop of the slurry or the like adhering to the buff head in the buff processing can be prevented. In the buff processing device of the embodiment illustrated in FIG. 8, when the buff head 500 is to be lifted up, the force of the spring 516 is not used unlike the embodiment in FIG. 5, but the head support portion 524 and the support member 526 are used. Thus, in the embodiment illustrated in FIG. 8, the spring constant of the spring 516 can be made smaller than the spring constant of the spring 516 in the embodiment in FIG. 5.

Figure 9A:
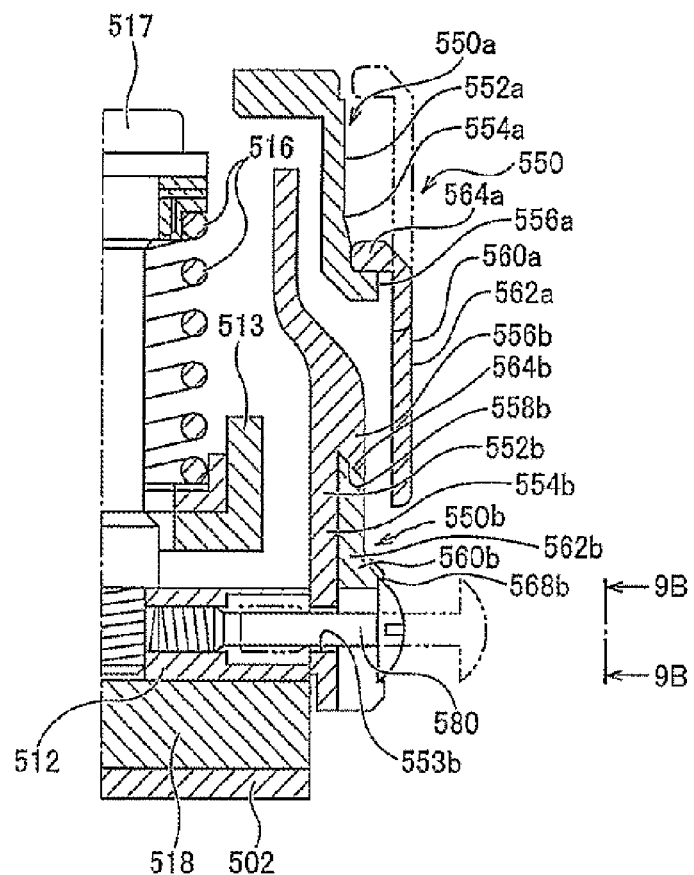
FIG. 9A is an enlarged view of a cover illustrated in FIG. 8.

Subsequently, the structure of the cover 550 according to the embodiment used in the buff processing device according to the present invention will be described in detail. As illustrated in FIG. 8, the cover 550 is formed by a substantially cylindrical member surrounding an outer periphery of the buff head 500. FIG. 9A is an enlarged view of the cover 550 illustrated in FIG. 8. As illustrated in FIGS. 8 and 9A, the cover 550 includes an outer cover 550*a* and an inner cover 550*b*. The outer cover 550*a* is mounted on a stationary part of the buff head 500. That is, even when the buff head 500 is rotated, the outer cover 550*a* is not rotated. On the other hand, the inner cover 550*b* is mounted on a rotating part of the buff head 500. That is, when the buff head 500 is rotated, the inner cover 550*b* is also rotated.

The outer cover 550*a* includes a first cover member 552*a* and a second cover member 560*a* mounted on the first cover member 552*a*. The first cover member 552*a* includes an axial portion 554*a* extending in a direction along the rotation shaft (shaft 510) of the buff head 500 and an outer projection portion 556*a* extending outward from the axial portion 554*a*.

The second cover member 560*a* includes an axial portion 562*a* extending in the direction along the rotation shaft (shaft 510) of the buff head 500 and an inner projection portion 564*a* extending inward from the axial portion 562*a*. As illustrated in FIG. 9A, the outer projection portion 556*a* of the first cover member 552*a* and the inner projection portion 564*a* of the second cover member 560*a* are engaged in the direction along the rotation shaft. Moreover, the inner projection portion 564*a* can slide with respect to the outer surface of the axial portion 554*a* of the first cover member 552*a*. Thus, the second cover member 560*a* can be made to slide with respect to the first cover member 552*a*. By means of such constitution, an access can be made to an inside of the buff head 500 easily without removing the outer cover 550*a*, and a maintenance work of the buff head 500 can be performed without removing the outer cover 550*a*.

The inner cover 550*b* includes a first cover member 552*b* and a second cover member 560*b* mounted on the first cover member 552*b*. The first cover member 552*b* includes an axial portion 554*b* extending in a direction along the rotation shaft (shaft 510) of the buff head 500 and an outer projection portion 556*b* extending outward from the axial portion 554*b*. A lower surface 558*b* (surface directed toward the wafer W) of the outer projection portion 556*b* is tilted with respect to the surface (wafer W surface) perpendicular to the rotation shaft of the buff head 500. As an embodiment, a tilt angle of the lower surface 558*b* of the outer projection portion 556*b* is approximately 45 degrees and is tilted so that an outer side of the outer projection portion 556*b* is located lower. Moreover, the first cover member 552*b* of the inner cover 550*b* includes a hole 553*b* through which a screw 580 which will be described later is passed.

The second cover member 560*b* of the inner cover 550*b* can have a constitution divided into three parts and can be configured such that one second cover member surrounds a third of the periphery of the buff head 500.

Figure 9B:
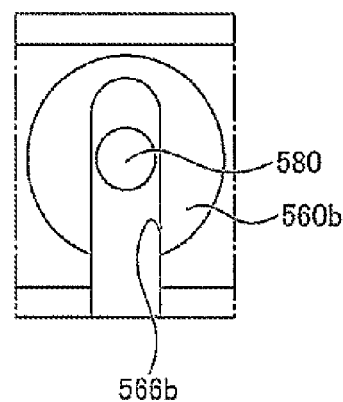
FIG. 9B is a view of the cover illustrated in FIG. 9A when seen from an arrow 9B.

The second cover member 560*b* of the inner cover 550*b* includes an axial portion 562*b* extending in the direction along the rotation shaft (shaft 510) of the buff head 500. An upper surface 564*b* (surface directed to a direction opposite to the wafer W) of the axial portion 562*b* is tilted with respect to the surface (wafer W surface) perpendicular to the rotation shaft of the buff head 500. As an embodiment, a tilt angle of the upper surface 564*b* of the axial portion 562*b* is approximately 45 degrees and is tilted so that an inner side of the axial portion 562*b* is located lower. The upper surface 564*b* is engaged with the lower surface 558*b* of the first cover member 552*b* when the second cover member 560*b* is mounted on the first cover member 552*b*. The axial portion 562*b* includes a slot 566*b* through which the screw 580 is passed. The slot 566*b* extends upward from a lower edge of the axial portion 562*b*. FIG. 9B is a view of the slot 566*b* in the second cover member 560*b* of the inner cover 550*b* in FIG. 9A when seen from an arrow 9B direction. A size of the slot 566*b* is such that the screw 580 is relatively movable in the slot 566*b*. Moreover, the axial portion 562*b* of the second cover member 560*b* in the inner cover 550*b* includes a stepped portion 568*b*. As illustrated in FIG. 9A, in the stepped portion 568*b*, a screw head of the screw 580 is engaged with the stepped portion 568*b* in attachment such that the lower surface 558*b* of the first cover member 552*b* and the upper surface 564*b* of the second cover member 560*b* are engaged. At this time, a shaft portion of the screw 580 is not brought into contact with an upper end of the slot 566*b*.

As illustrated in FIG. 9A, the first cover member 552*b* and the second cover member 560*b* of the inner cover 550*b* can be connected together to the buff head body 512 by the screw 580. By loosening the screw 580, the engagement between the screw head and the stepped portion 568*b* is released, and the second cover member 560*b* can be moved downward by the slot 566*b*. Thus, the engagement between the lower surface 558*b* of the first cover member 552*b* and the upper surface 564*b* of the second cover member 560*b* is released, and the second cover member 560 can be removed from the first cover member 552*b* without fully removing the screw 580. By means of such constitution, drop of the screw 580 can be prevented, and an access can be made to the inside of the buff head 500 easily in maintenance.

Figure 10A:
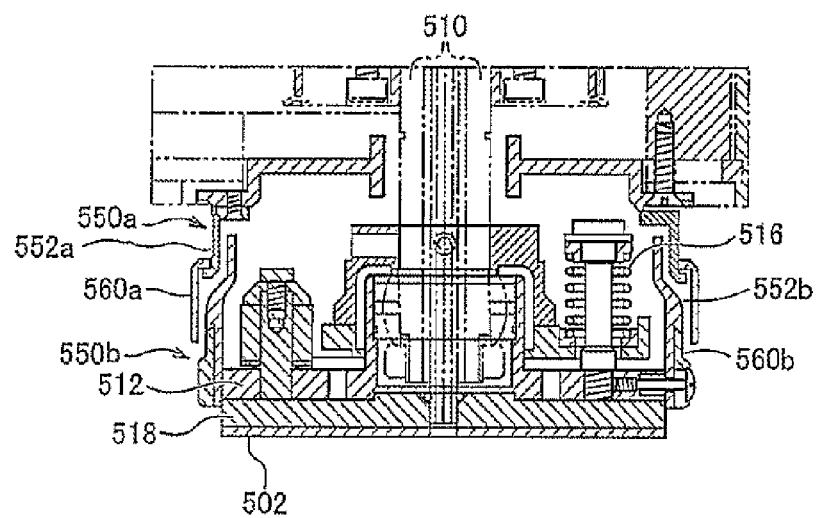
FIG. 10A is a schematic sectional view in the vicinity of the buff head of the buff processing device according to the embodiment and a view illustrating a state where an outer cover and an inner cover are close to each other.
Figure 10B:
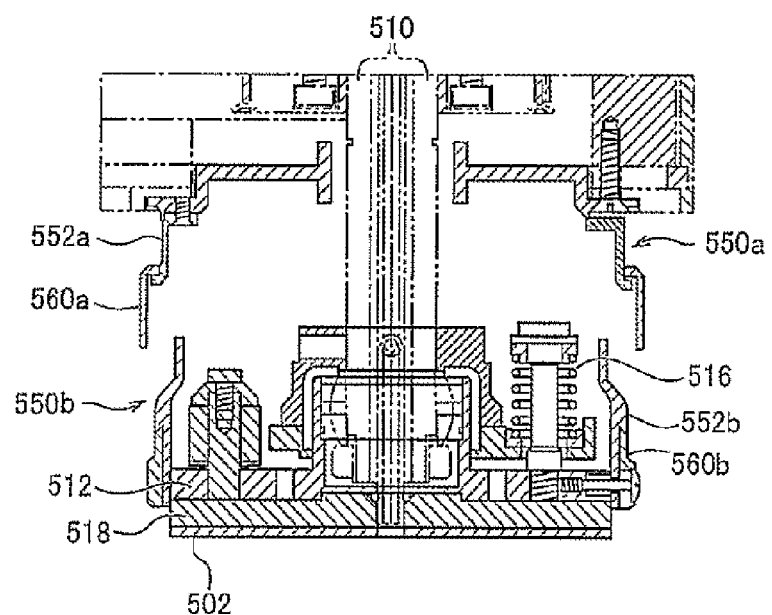
FIG. 10B is a schematic sectional view in the vicinity of the buff head of the buff processing device according to the embodiment and a view illustrating a state where an outer cover and an inner cover are separated from each other.
Figure 10C:
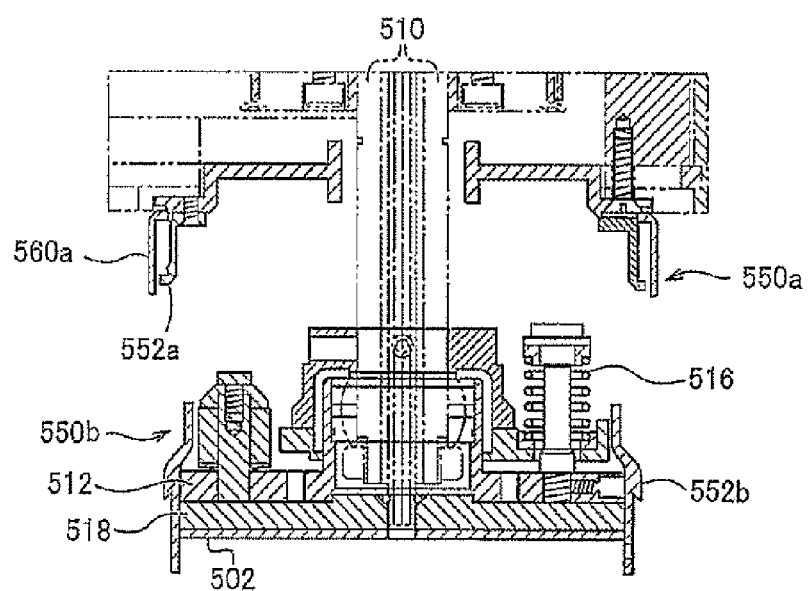
FIG. 10C is a schematic sectional view in the vicinity of the buff head of the buff processing device according to the embodiment and a view illustrating a state where a second cover member of the outer cover is slid upward with respect to a first cover member, and the inner cover is lowered.

The outer cover 550*a* and the inner cover 550*b* are configured to be separable from each other in the axial direction. FIGS. 10A, 10B, and 10C are views illustrating states where the outer cover 550*a* and the inner cover 550*b* are separated. FIG. 10A illustrates a state where the outer cover 550*a* and the inner cover 550*b* are close to each other, and the buff head 500 is raised. FIG. 10B illustrates a state where the outer cover 550*a* and the inner cover 550*b* are separated by lowering the buff head 500. FIG. 10C is a view illustrating a state where the second cover member 560*a* of the outer cover 550*a* is made to slide upward with respect to the first cover member 552*a*, the buff head 500 is lowered, and the inner cover 550*b* is lowered. Moreover, FIG. 10C is a view illustrating a state where the second cover member 560*b* of the inner cover 550*b* is removed, and the first cover member 552*b* of the inner cover 550*b* is lowered. In the state in FIG. 10C, an access can be made to the inside of the buff head 500 easily, and maintenance can be performed. In performing the maintenance, an order of the lowering of the buff head 500, the sliding of the second cover member 560*a* of the outer cover 550*a* upward, and lowering of the inner cover 550*b* is arbitrary. For example, it can be such that (1) after the outer cover 550*a* and the inner cover 550*b* are separated by lowering the buff head 500, (2) the second cover member 560*b* of the inner cover 550*b* is removed, and the first cover member 552*b* of the inner cover 550*b* is lowered and then, (3) the second cover member 560*a* of the outer cover 550*a* is made to slide upward for carrying out the maintenance. Alternatively, as another example, it can be such that (1) after the second cover member 560*b* of the inner cover 550*b* is removed, and the first cover member 552*b* of the inner cover 550*b* is lowered, (2) the buff head 500 is lowered so as to separate the outer cover 550*a* and the inner cover 550*b*, and then, (3) the second cover member 560*a* of the outer cover 550*a* is made to slide upward for carrying out the maintenance.

The embodiments of the present invention have been described as above, but the present invention is not limited to the aforementioned embodiments. Moreover, each feature of the aforementioned embodiments can be combined or replaced as long as they do not contradict each other. Moreover, in the embodiment of the present invention, it is described that the substrate is arranged laterally so that the processing surface thereof is directed upward, and the buff head is pressed from above the substrate for the buff processing, but the substrate may be arranged vertically, and the buff head may be pressed onto the substrate from the side for the buff processing.

[Form 1] According to a first form, a buff processing device for executing buff processing of a substrate is provided. Such buff processing device has a rotatable shaft, a buff head body, a torque transmission mechanism for transmitting rotation of the shaft to the buff head body, and an elastic member for elastically supporting the buff head body in the longitudinal direction of the shaft.

[Form 2] According to a second form, in the buff processing device in the first form, the torque transmission mechanism and the elastic member include the bellows-type cup ring, and the bellows-type cup ring has one end coupled to the shaft directly or indirectly, while the other end is coupled to the buff head body.

[Form 3] According to a third form, in the buff processing device in the first form, the torque transmission mechanism includes a driving pin for transmitting the rotation of the shaft to the buff head body, and the elastic member includes a spring.

[Form 4] According to a fourth form, in the buff processing device in the third form, the numbers of the driving pin and the spring are three or more, respectively, and they are arranged on the entire circumference of the buff head body, respectively, at an equal interval.

[Form 5] According to a fifth form, in the buff processing device in any one of the first to fourth forms, a buff pad carrier removably mounted on the buff head body and a buff pad mounted on the buff pad carrier are provided.

[Form 6] According to a sixth form, in the buff processing device in any one of the first to fifth forms, a gimbal mechanism slidably supporting the buff head body is provided.

[Form 7] According to a seventh form, in the buff processing device in the sixth form, a rotation center of the gimbal mechanism is configured to be close to a surface of the buff pad in a state where the buff pad is mounted.

[Form 8] According to an eighth form, in the buff processing device in the seventh form, the rotation center of the gimbal mechanism is configured to be within a range of 10 mm from the surface of the buff pad in the state where the buff pad is mounted.

[Form 9] According to a ninth form, in the buff processing device in any one of the sixth to eighth forms, the gimbal mechanism has a spherical sliding bearing.

[Form 10] According to a tenth form, in the buff processing device in any one of the first to ninth forms, the buff processing device has a head support portion fixed to the shaft directly or indirectly and a support member fixed to the buff head body, the shaft is movable in the longitudinal direction of the shaft, and the head support portion is configured to be separated from the support member when the substrate is subjected to the buff processing and to be brought into contact with the support member when the buff head body is moved in a direction separated from the substrate.

[Form 11] According to an eleventh form, in the buff processing device in the tenth form, the head support portion has a spherical recess surface in contact with the buff head body, the buff head body has a spherical projection surface in contact with the spherical recess surface, and the gimbal mechanism is configured by the spherical recess surface of the head support portion and the spherical projection surface of the buff head body.

[Form 12] According to a twelfth form, in the buff processing device in any one of the first to ninth forms, a cover at least partially surrounding the shaft, the buff head body, the torque transmission mechanism, and the elastic member is provided.

[Form 13] According to a thirteenth form, a cover capable of being mounted on a rotatable buff head used in a buff processing device for executing buff processing of a substrate is provided. Such cover has a first cover member and a second cover member mounted on the first cover member, and the second cover member is configured to be slidable with respect to the first cover member.

[Form 14] According to a fourteenth form, in the cover in the thirteenth form, the first cover member has an axial portion extending in a direction along a rotation shaft of the buff head and an outer projection portion extending outward from the axial portion, the second cover member has an axial portion extending in the direction along the rotation shaft of the buff head and an inner projection portion extending inward from the axial portion, the outer projection portion and the inner projection portion are capable of engagement in the direction along the rotation shaft, and the inner projection portion is slidable with respect to an outer surface of the axial portion of the first cover member.

[Form 15] According to a fifteenth form, in the cover in the thirteenth or fourteenth form, the cover is configured to be mounted on a stationary part of the buff head.

[Form 16] According to a sixteenth form, a cover capable of being mounted on a rotatable buff head used in a buff processing device for executing buff processing of a substrate is provided. Such cover has a first cover member and a second cover member mounted on the first cover member, and the second cover member is configured to be removable from the first cover member.

[Form 17] According to a seventeenth form, in the cover in the sixteenth form, the first cover member has an axial portion extending in a direction along a rotation shaft of the buff head and an outer projection portion having a tilt surface projecting outward from the axial portion and tilted with respect to a surface perpendicular to the rotation shaft, and the second cover member has an axial portion extending in the direction along the rotation shaft of the buff head and a tilt surface capable of being engaged with the tilt surface of the first cover member.

[Form 18] According to an eighteenth form, in the cover in the sixteenth or seventeenth form, the second cover member is configured by a plurality of cover members capable of being divided, and the plurality of cover members is configured to be capable of being mounted on the first cover member, respectively.

[Form 19] According to a nineteenth form, in the cover in any one of the sixteenth to eighteenth forms, a fastener for fixing the first cover member and the second cover member is provided, and in a state where the first cover member and the second cover member are fixed, the tilt portion of the first cover member and the tilt portion of the second cover member are engaged, and in a state where the fastener is loosened, the engagement between the tilt portion of the first cover member and the tilt portion of the second cover member is released.

[Form 20] According to a twentieth form, in the cover in the nineteenth form, the first cover member has a hole having a dimension through which the fastener is passed, the second cover member has a slot through which the fastener is passed, and in a state where the fastener is loosened, the second cover member can be removed from the fastener through the slot without removing the fastener.

[Form 21] According to a twenty first form, in the cover in any one of the sixteenth to twentieth forms, the cover is configured to be mounted on a rotation portion of the buff head.

[Form 22] According to a twenty second form, in the cover in the twenty first form, the cover is mounted on a buff head body of the buff processing device in any one of claims 1 to 12.

[Form 23] According to a twenty third form, a substrate processing device is provided. Such substrate processing device has the buff device in any one of the first to twelfth forms, a conveyance mechanism for conveying the substrate, a washing unit for washing the substrate, and a drying unit for drying the substrate.

[Form 24] According to a twenty fourth form, a maintenance method of a buff processing device having a first cover and a second cover mounted on an inner side of the first cover is provided. Such method has a process of lowering a buff head of the buff processing device, a process of separating a shaft body on which the first cover is separated and the buff head on which the second cover is mounted in an axial direction and of separating the first cover and the second cover, a process of sliding the second cover member configured to be slidable in an axial direction upward in the axial direction with respect to the first cover member in the first cover fixed to the shaft body, and a process of removing the second cover member in the second cover mounted on the buff head from the buff head and of sliding the first cover member of the second cover in the axial direction. In such maintenance method, an order of the process of lowering the buff head, the process of sliding the second member of the first cover member, and the process of sliding the first cover member of the second cover is arbitrary.

This application claims for priority based on Japanese Patent Application No. 2015-224669 filed on Nov. 17, 2015. All the disclosed contents including the Description, Claims, Drawings, and Abstract of Japanese Patent Application No. 2015-224669 are incorporated as a whole in this application by reference. All the disclosed contents including the Description, Claims, Drawings, and Abstract of Japanese Patent Application No. 2010-50436 (Patent Literature 1) and Japanese Patent Application No. 11-162893 (Patent Literature 2) are incorporated as a whole in this application by reference.

REFERENCE SIGNS LIST 500 buff head
502 buff pad
510 shaft
511 boss
512 buff head body
513 buff head flange
514 driving pin
516 spring
517 bolt
518 buff pad carrier
520 spherical sliding bearing
520a inner ring
520b outer ring
522 bellows-type cup ring
524 head support portion
526 support member
550 cover
550a outer cover
550b inner cover
552a first cover member
560a second cover member
554a axial portion
556a outer projection portion
562a axial portion
564a inner projection portion
552b first cover member
560b second cover member
553b hole
554b axial portion
556b outer projection portion
558b lower surface
562b axial portion
564b upper surface
566b slot
568b stepped portion
580 screw

The invention claimed is:

1. A buff processing device for executing buff processing of a substrate, comprising:
   a rotatable shaft;
   a buff head body;
   a torque transmission mechanism for transmitting rotation of the shaft to the buff head body; and
   an elastic member for elastically supporting the buff head body in a longitudinal direction of the shaft,
   wherein the buff processing device has a head support portion fixed to the shaft directly or indirectly and a support member fixed to the buff head body;

the shaft is movable in the longitudinal direction of the shaft; and the head support portion is configured to be separated from the support member when the substrate is subjected to the buff processing and to be brought into contact with the support member when the buff head body is moved in a direction separated from the substrate.

2. The buff processing device according to claim 1, wherein the torque transmission mechanism and the elastic member include a bellows-type cup ring; and the bellows-type cup ring has one end coupled to the shaft directly or indirectly, while the other end is coupled to the buff head body.

3. The buff processing device according to claim 1, wherein the torque transmission mechanism includes a driving pin for transmitting the rotation of the shaft to the buff head body; and the elastic member includes a spring.

4. The buff processing device according to claim 3, wherein the numbers of the driving pin and the spring are three or more, respectively, and they are arranged on the entire circumference of the buff head body, respectively, at an equal interval.

5. The buff processing device according to claim 1, further comprising:

a buff pad carrier removably mounted on the buff head body; and a buff pad mounted on the buff pad carrier.

6. The buff processing device according to claim 1, further comprising:

a gimbal mechanism slidably supporting the buff head body.

7. The buff processing device according to claim 6, wherein a rotation center of the gimbal mechanism is configured to be within a distance of 0.1 times or less the diameter of the buff pad to a surface of the buff pad.

8. The buff processing device according to claim 6, wherein the rotation center of the gimbal mechanism is within a range of 10 mm from a surface of the buff pad in the state where the buff pad is mounted.

9. The buff processing device according to claim 6, wherein the gimbal mechanism has a spherical sliding bearing.

10. The buff processing device according to claim 6, wherein the head support portion has a spherical recess surface in contact with the buff head body;

the buff head body has a spherical projection surface in contact with the spherical recess surface; and the gimbal mechanism is configured by the spherical recess surface of the head support portion and the spherical projection surface of the buff head body.

11. The buff processing device according to claim 1, wherein a cover at least partially surrounding the shaft, the buff head body, the torque transmission mechanism, and the elastic member is provided.

12. A substrate processing device, comprising:

the buff device according to claim 1;

a conveyance mechanism for conveying the substrate;

a washing unit for washing the substrate; and a drying unit for drying the substrate.

* * * * *